United States Patent [19]
Hong

[11] Patent Number: 5,523,251
[45] Date of Patent: *Jun. 4, 1996

[54] METHOD FOR FABRICATING A SELF ALIGNED MASK ROM

[75] Inventor: Gary Hong, Hsinchu, Taiwan

[73] Assignee: United Microelectronics Corp., Hsinchu, Taiwan

[ * ] Notice: The term of this patent shall not extend beyond the expiration date of Pat. No. 5,308.777.

[21] Appl. No.: 318,473

[22] Filed: Oct. 5, 1994

[51] Int. Cl.⁶ .................................................. H01L 21/265
[52] U.S. Cl. .................. 437/48; 437/45; 437/52
[58] Field of Search .................. 437/45, 48, 52; 257/390

[56] References Cited

U.S. PATENT DOCUMENTS

5,308,777   5/1994   Hong .......................................... 437/41

*Primary Examiner*—H. Jey Tsai
*Attorney, Agent, or Firm*—Ladas & Parry

[57] ABSTRACT

A method of manufacturing mask ROM using LPD to obtain the advantages of self-alignment. The bit line resistance and bit line capacitance are both reduced due to prevention of counterdoping but the device breakdown voltage is maintained. Oxide regions are deposited over the bit lines by LPD to form mesas thereon. When a conductive layer is deposited, recesses in the conductive layer occur in channel regions between neighboring mesas. When programming the device by implanting impurities, they automatically concentrate in the channel regions between the bit lines, in a self-aligned manner, therefore counterdoping of the bit lines is prevented.

7 Claims, 7 Drawing Sheets

METHOD FOR FABRICATING A SELF ALIGNED MASK ROM

BACKGROUND OF THE INVENTION

1. Technical Field

The present invention is directed to a mask read-only-memory (mask ROM) and a method for manufacturing same. More particularly, the present invention is directed to a method for manufacturing a mask ROM using self-alignment techniques.

2. Background of the Prior Art

Figure 1:
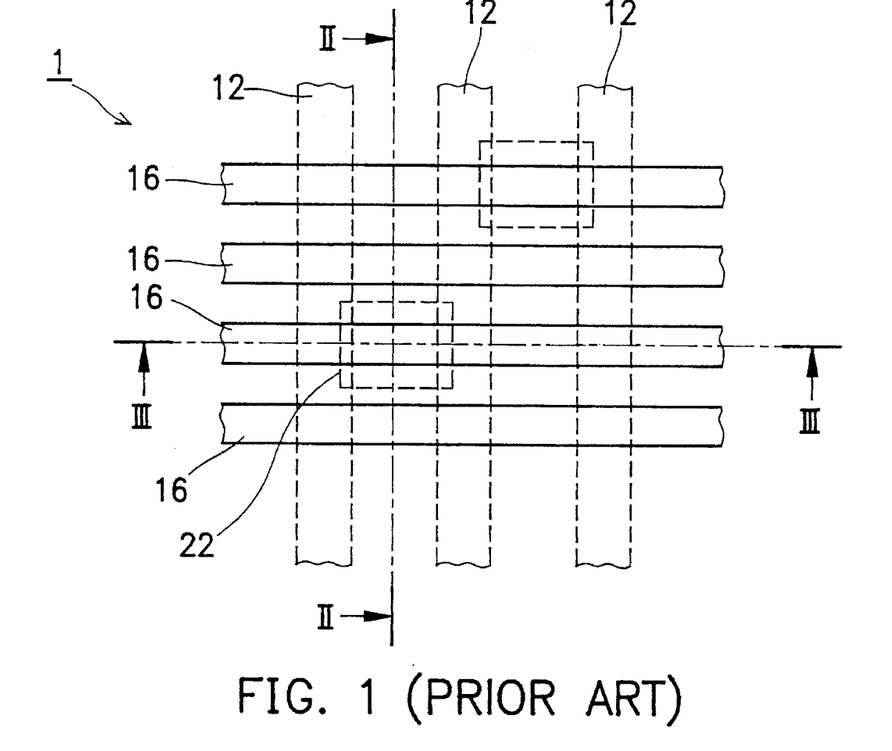
FIG. 1 is a top view of the structure of the conventional mask ROM.
Figure 2:
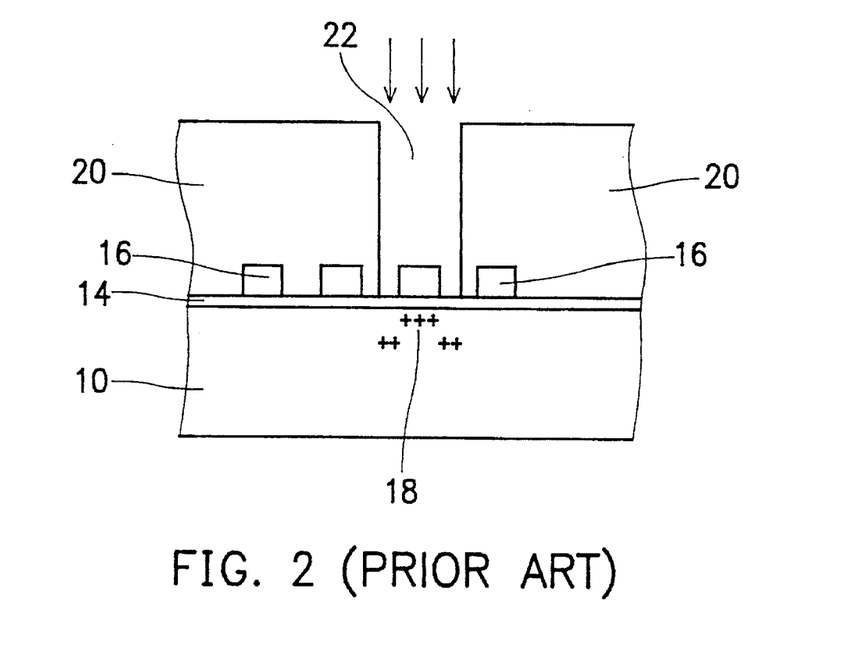
FIG. 2 is a cross-sectional view of the conventional mask ROM taken along line II—II in FIG. 1.
Figure 3:
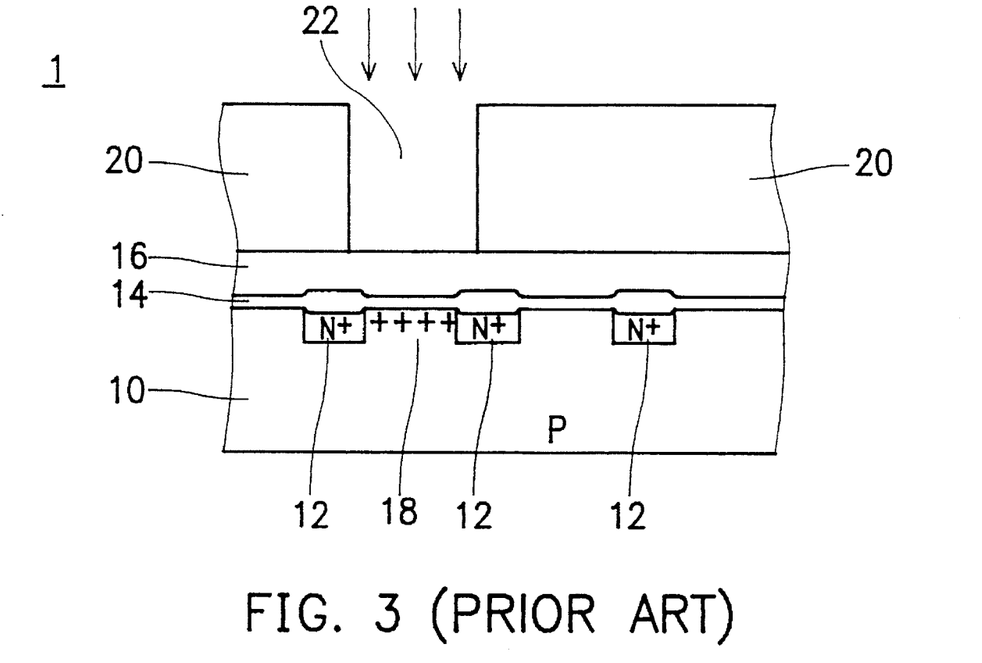
FIG. 3 is a cross-sectional view of the conventional mask ROM taken along line III—III in FIG. 1.

The structure of a conventional mask ROM is shown in FIGS. 1, 2, and 3, where FIG. 1 is a top view of the mask ROM, and FIGS. 2, 3 are cross-sectional views taken along lines II—II and III—III respectively. Mask ROM 1 includes a P type semiconductor substrate 10, a plurality of $N^+$ bit lines 12 formed on substrate 10 by implantation, a gate oxide layer 14 formed on the substrate 10 and the bit lines 12, and a plurality of word lines 16 formed on the gate oxide layer 14.

The mask ROM is used to store predetermined data which need not be changed. Each bit of the data is stored in a corresponding memory cell of the mask ROM, each of which comprises a metal-oxide-semiconductor (MOS) transistor with its channel being located under a word line between two bit lines. Predetermined memory cells are implanted with P type impurities, such as Boron, so that their threshold voltage is raised. As a result, they become non-conducting (or inactive) at normal operating voltages. Therefore, the data bits can be programmed by the state of conduction of the MOS transistors. For example, a conductive MOS transistor lci can be used to represent "0", while a non-conductive MOS transistor, which has been made non-conducting and hence inactive by the implantation of impurities in its gate region, can be used to represent "1".

In the conventional implantation process for programming, a photoresist layer 20 is initially coated on the mask ROM 1. Openings 22 are then formed in the photoresist layer 20 over the cells to be programmed by lithography techniques. Boron ions are implanted through the opening 22 to form a $P^+$ doped region 18 in the channel region in the MOS transistor being programmed. Therefore, when a normal voltage is placed on the word line 16, the bit lines 12 will not become conductive.

With the reduction in the scale of semiconductor integrated circuits, the width of the word lines 16 are becoming smaller. However, the amount of reduction in the width of the opening 22 is limited by factors in lithography processes used, such as difficulties in making the patterned mask 20 register correctly. As a result, misalignment of the opening 22 is a problem which has inhibited the development of smaller circuits. The misalignment problem plus lateral diffusion of the impurities induces counterdoping of the bit lines 12, which increases the bit line resistance, increases bit line capacitance, and lowers breakdown voltage. High bit line resistance and high bit line capacitance will slow down the speed of the circuit. Low breakdown voltage will result in circuit malfunctions. In the worst condition, adjacent memory cells will be mistakenly doped, which results in errors of data.

SUMMARY OF THE INVENTION

The primary object of the present invention is to provide a method for fabricating a mask ROM, using a self-alignment technique to prevent the disadvantages of counterdoping.

Another object of the present invention is to provide a method for fabricating a mask ROM, which has lower bit line resistance and bit line capacitance, while maintaining high breakdown voltage.

Another object of the present invention is to provide a mask ROM which has the aforedescribed features.

The objects of the present invention are fulfilled by providing a method for fabricating a mask ROM on a semiconductor substrate, the mask ROM having bit lines and word lines. The method comprises the steps of: (a) forming a gate oxide on the substrate; (b) forming a first conductive layer on said gate oxide; (c) forming a mask layer on said first conductive layer; (d) etching said mask layer and said first conductive layer using a bit line mask; (e) implanting impurities into the substrate to form the bit lines of the mask ROM; (f) depositing oxide on said gate oxide by LPD to a thickness larger than the thickness of the first conductive layer; (g) removing said mask layer; (h) forming a second conductive layer thereon; and (i) etching said second conductive layer and said first conductive layer to form the word lines of the mask ROM.

In another aspect the present invention provides a ROM comprising: a semiconductor substrate with a plurality of bit lines formed in the substrate, oxide regions disposed directly over the bit lines to define a plurality of oxide mesas and a plurality of conductive word lines disposed on the substrate and on the oxide mesas. Each word line has a major axis which is arranged at generally a right angle to the major axes of the oxide mesas whereby recesses occur in the conductive word lines in channel regions between neighboring mesas. The recesses define paths for the implantation of impurities into selected channel regions to program said ROM.

BRIEF DESCRIPTION OF THE FIGURES

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENT

Figure 4:
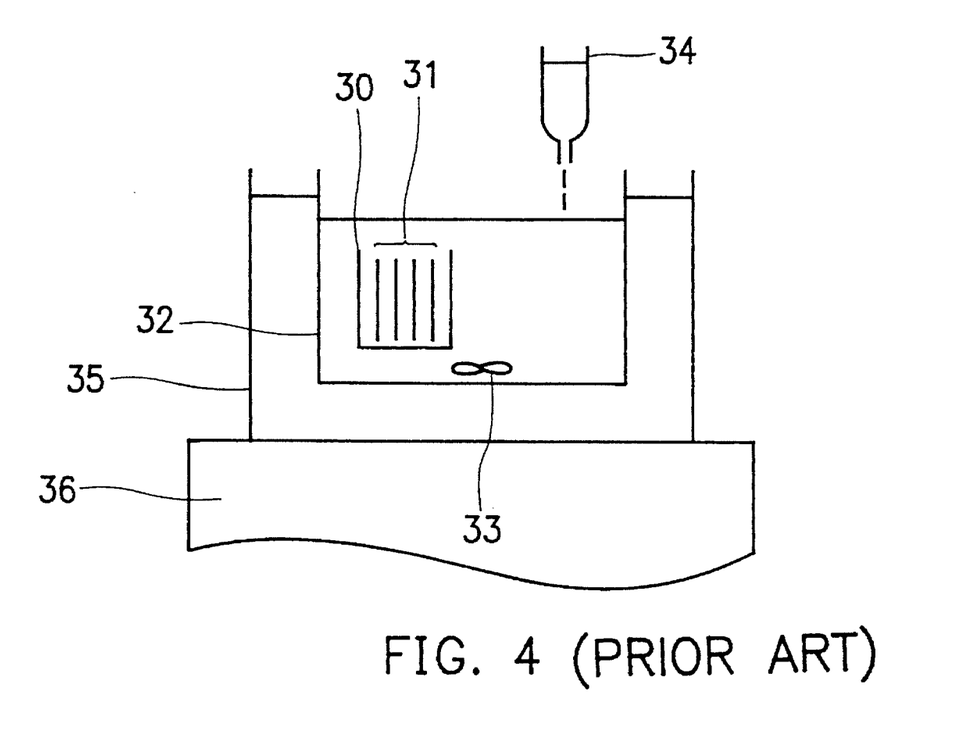
FIG. 4 is a schematic diagram of a liquid phase selective deposition device.
Figure 5:
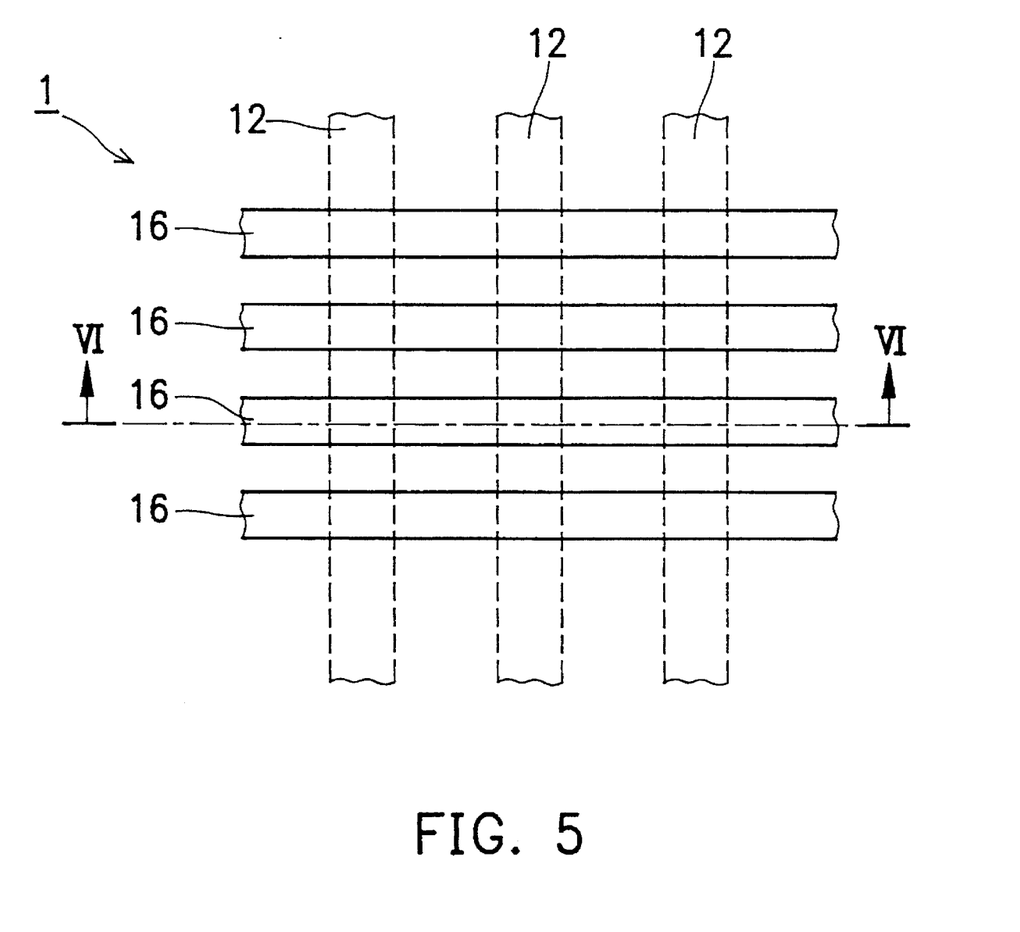
FIG. 5 is a top view of the structure of a mask ROM according to the present invention.

Liquid phase deposition (LPD) is known as a selective deposition method. A example of LPD is discussed hereinafter. Referring to FIG. 4, a container 30 is used to support silicon wafers 31 and placed in a reactor 32. The reactor 32 is filled with saturated $H_2SiF_6$ as reactive liquid. A propeller 33 is used to stir the reactive liquid. An injector 34 injects boric acid ($H_3BO_3$) into the reactor 32 to keep the $H_2SiF_6$ saturated. The reactor 32 is placed in a water bath 35 and heated by a heater 36. The reaction equation is:

$$H_2SiF_6 + 2H_2O \leftarrow\rightarrow 6HF + SiO_2$$

$$H_3BO_3 + 4HF \leftarrow\rightarrow BF_4^- + H_3O^+ + 2H_2O$$

Liquid phase deposition has an excellent deposition selectivity. Oxides only deposits on silicon oxide and polysilicon, and not on tungsten or photoresist. Using this characteristic, self-alignment can be achieved in implanting mask ROM.

FIG. 5 and FIGS. 6a to 6g show a preferred embodiment of the present invention, which is applied to a P type substrate 10 to implant a mask ROM. A method used to make disclosed device is now described:

STEP 1

Figure 6A:
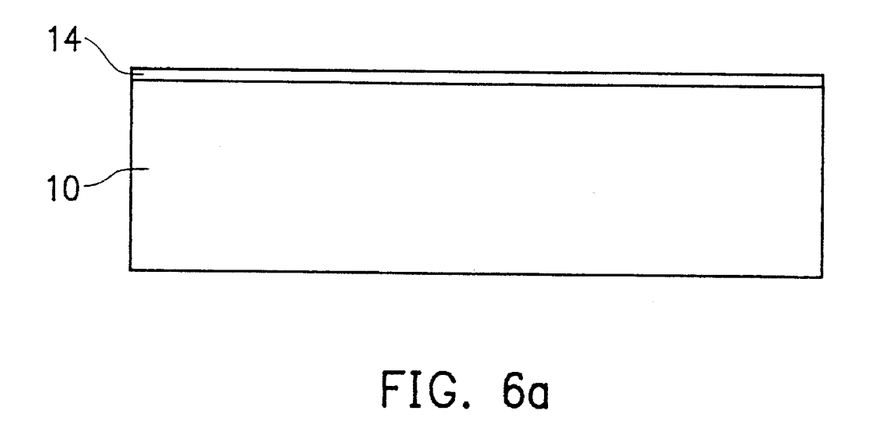
FIGS. 6a to 6g are cross-sectional views taken along line VI—VI in the FIG. 5 showing a method of manufacturing the mask ROM on a P type substrate according to the present invention.

As shown in FIG. 6a, gate oxide 14 is formed on P type substrate 10. This step may be done by various conventional methods understood by those skilled in the art, including by thermal oxidation. The thickness of the gate oxide 14 is preferably about 100 to 200 Å.

STEP 2

Figure 6B:
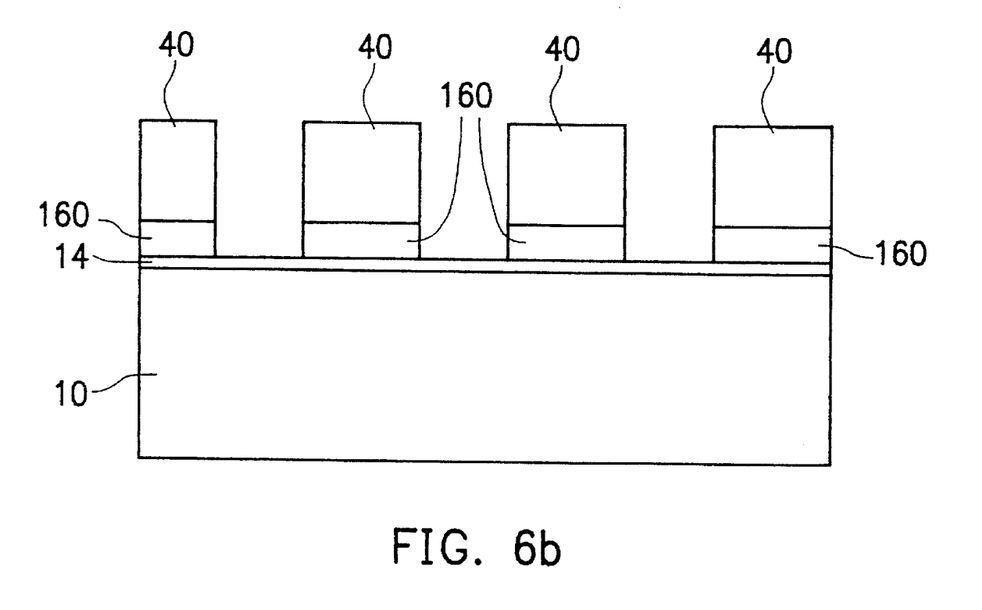

As shown in FIG. 6b, a first conductive layer 160 is formed on the gate oxide 14, and a photoresist layer 40 is formed on the first conductive layer 160. For example, the first conductive layer 160 can be formed by depositing polysilicon on the gate oxide 14, and the photoresist layer 40 can be formed by coating photoresist on the first conductive layer 160. The thickness of the first conductive layer 160 is about 500 to 3000 Å. The photoresist layer 40 is exposed and developed using a bit line mask which covers regions between the bit lines 12 that will be formed. Then the first conductive layer 160 is etched preferably by using reactive ion etching (RIE), as shown in FIG. 6b.

STEP 3

Figure 6C:
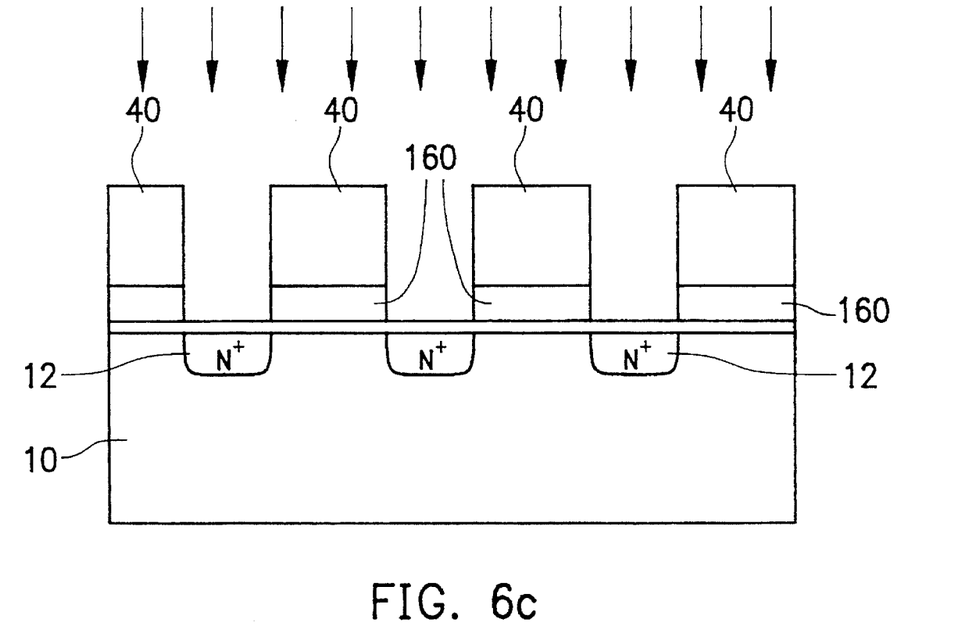

As shown in FIG. 6c, N type impurities are implanted into the P type substrate 10 using the photoresist layer 40 as a mask to form bit lines 12. In this embodiment, the impurity preferably is As, with a dosage about $2\times10^{15}$ atoms/cm$^2$ and a kinetic energy about 50 KeV.

STEP 4

Figure 6D:
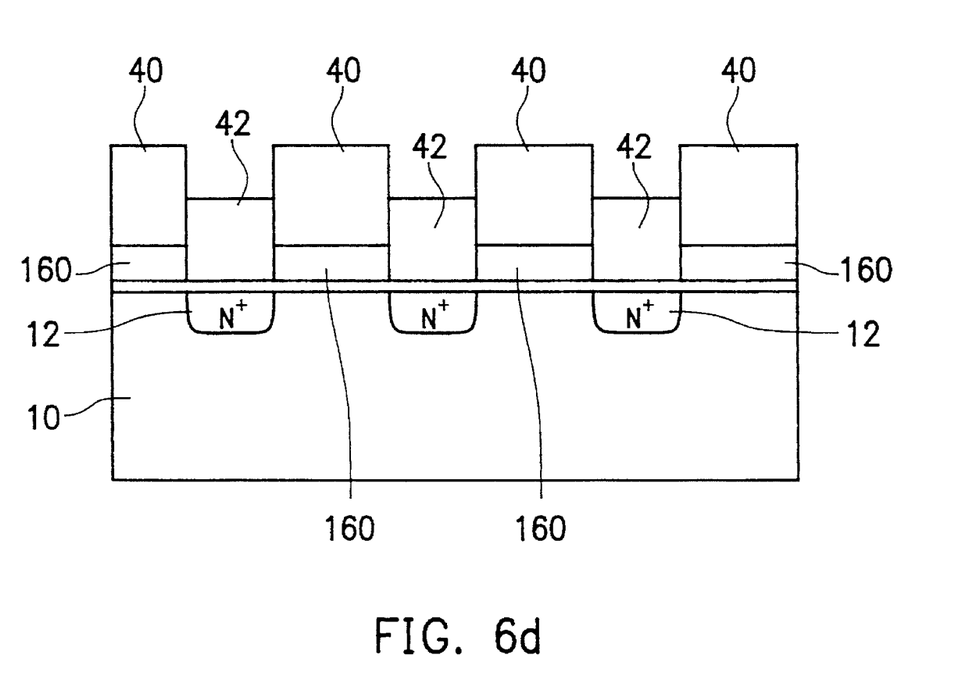

As shown in FIG. 6d, using the photoresist layer 40 as a mask, oxide 42 is deposited on the gate oxide 14 using LPD. The thickness of the oxide 42 is about 1000 to 5000 Å, which is greater than the thickness of the first conductive layer 160. Then the photoresist layer 40 is removed. Since LPD has excellent deposition selectivity, oxide will only deposited on the gate oxide 14. The resulting oxide regions 42 define oxide mesas which are disposed essentially directly over the underlying bit lines 12.

STEP 5

Figure 6E:
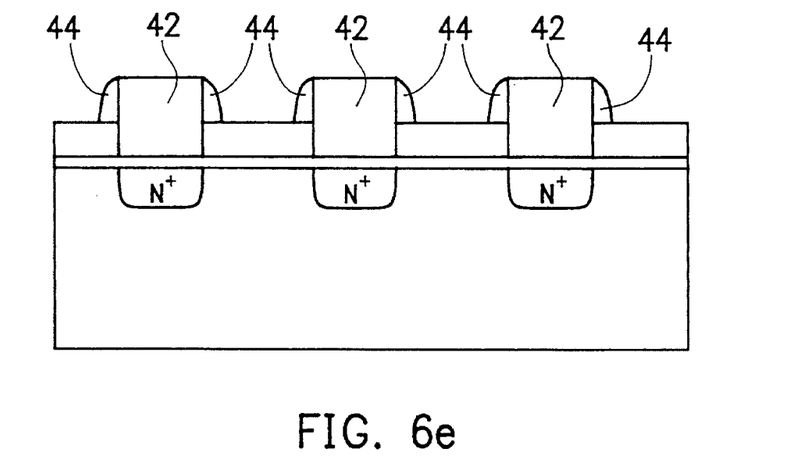

As shown in FIG. 6e, sidewall spacers 44 may be formed on the exposed sidewalls of oxide 42. For example, oxide or nitride may be initially deposited by chemical vapor deposition (CVD) and then etched using plasma etching to form the sidewall spacers 44. The sidewall spacers 44 are helpful to further improve the characteristics of the mask ROM. However, this step is optional and may be omitted if desired.

STEP 6

Figure 6F:
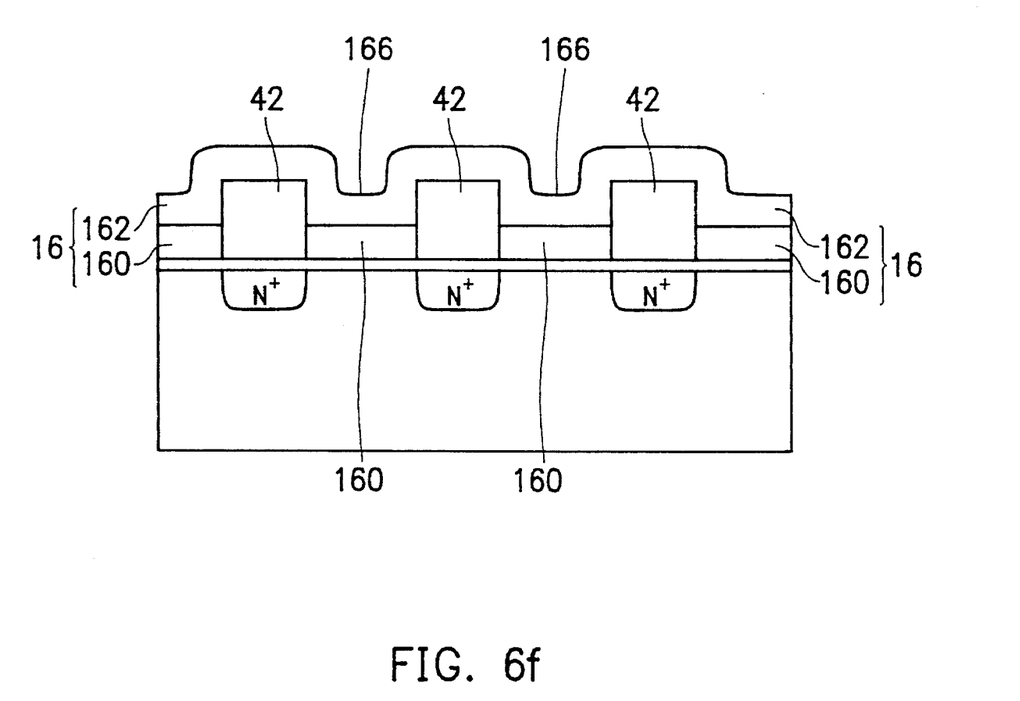

As shown in FIG. 6f, a second conductive layer 162 is deposited on the first conductive layer 160 and the oxide 42. In this figure it is assumed that the sidewall spacers 44 are not formed. The first conductive layer 160 and the second conductive layer 162 are patterned using conventional techniques to form word lines 16. Word lines 16 have recesses 166 between oxides 42. This is done by conventional deposition, lithography, and etching steps. For example, polysilicon or silicide is deposited to form the second conductive layer 162. Then the second conductive layer 162 and the first conductive layer 160 are etched using a word line mask by conventional lithography techniques to form a plurality of word lines 16 which are arranged at generally a right angle to bit lines 12. Recesses 166 occur in the conductive word lines 160, 162 in channel regions between neighboring mesas 42. If the sidewall spacers 44 of FIG. 6e are formed, then the width of the recesses 166 will be smaller.

STEP 7

Figure 6G:
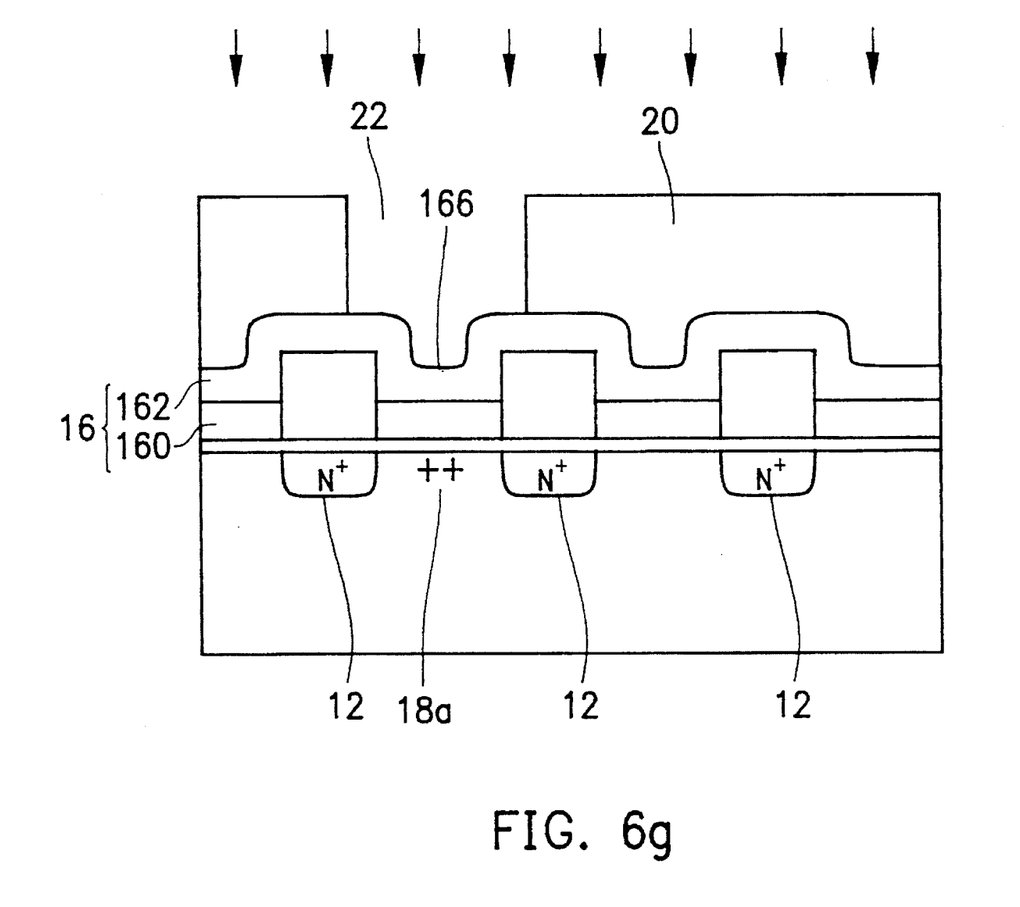

As shown in FIG. 6g, predetermined memory cells are implanted with impurities through the recesses 166 to make them inactive (i.e., non-conducting). The remaining memory cells remain active. For example, a photoresist layer 20 is deposited. Windows 22 are formed in the photoresist layer 20, using conventional lithography techniques, over the predetermined memory cells which are to be programmed. Boron ions with a dosage of $1\times10^{14}$ atoms/cm$^2$ at about 150 KeV are implanted into the substance 10 to form doped regions 18a in the channel region of each of the memory cells which are to become inactive. The recess 166 on the surface of each memory cell automatically concentrates the impurities beneath the exposed recesses 166 and in the underlying channel regions in a self-aligned manner.

Although not described in detail, it should be apparent to those skilled in the art that the aforedescribed method can be applied to a mask ROM which has an N type substrate—for example, by making appropriate changes to the dopants used. This is familiar to those skilled in the art.

As stated above, since there is a recess 166 on the surface of each memory cell, impurities are self-aligned concentrated beneath the recess 166 without misalignment. Therefore, the bit lines will not be counterdoped, and the side diffusion of the impurities is reduced. As a result, the bit line resistance and the bit line capacitance are both reduced, while the breakdown voltage is maintained high.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a mask ROM on a semiconductor substrate, the mask ROM having bit lines and word lines, which comprises the following steps:

(a) forming a gate oxide on the substrate;

(b) forming a first conductive layer on said gate oxide;

(c) forming a mask layer on said first conductive layer;

(d) etching said mask layer and said first conductive layer using a bit line mask;

(e) implanting impurities into the substrate to form the bit lines of the mask ROM;

(f) depositing an oxide layer on said gate oxide to form oxide regions having a thickness greater than a thickness of the first conductive layer;

(g) removing said mask layer;

(h) forming a second conductive layer thereon; and (i) etching said second conductive layer and said first conductive layer to form the word lines of the mask ROM.

2. A method of fabricating a mask ROM on a semiconductor substrate as claimed in claim 1, further including the step of implanting impurities into regions of the substrate via said first conductive layer and said second conductive layer.

3. A method of fabricating a mask ROM on a semiconductor substrate as claimed in claim 1, wherein step (f) further comprises forming sidewall spacers beside said oxide regions.

4. A method of fabricating a mask ROM on a semiconductor substrate as claimed in claim 3, wherein said sidewall spacers comprise oxide.

5. A method of fabricating a mask ROM on a semiconductor substrate as claimed in claim 3, wherein said sidewall spacers comprise nitride.

6. A method of fabricating a mask ROM on a semiconductor substrate as claimed in claim 1, wherein said first conductive layer and said second conductive layer both comprise polysilicon.

7. A method of fabricating a mask ROM on a semiconductor substrate as claimed in claim 1, wherein said first conductive layer comprises polysilicon and said second conductive layer comprises silicide.

* * * * *